United States Patent [19]
Mou et al.

[11] Patent Number: 6,096,635
[45] Date of Patent: Aug. 1, 2000

[54] METHOD FOR CREATING VIA HOLE IN CHIP

[75] Inventors: Tse-Chi Mou, Taipei; Shiang Ching Cheng, Hsin Chu; Chin-Yi Chou, Hsin Chu; Arnold Chang-Mou Yang, Hsin Chu, all of Taiwan

[73] Assignee: Microjet Technology Co., Ltd., Hsin Chu, Taiwan

[21] Appl. No.: 08/984,299

[22] Filed: Dec. 3, 1997

[51] Int. Cl.[7] .................................................. H01L 21/4763
[52] U.S. Cl. ........................... 438/637; 438/598; 438/618; 438/633; 438/638; 438/667; 438/671; 438/689; 438/690; 438/691; 438/693; 438/706; 438/723; 438/743; 438/928; 438/959
[58] Field of Search ...................................... 438/598, 618, 438/633, 637, 638, 667, 671, 689, 690, 691, 693, 706, 723, 743, 928, 959

[56] References Cited

U.S. PATENT DOCUMENTS

| | | | |
|---|---|---|---|
| 5,858,808 | 1/1999 | Igel et al. | 438/42 |
| 5,943,588 | 8/1999 | Watrobski et al. | 438/401 |
| 6,010,956 | 1/2000 | Takiguchi et al. | 438/623 |

FOREIGN PATENT DOCUMENTS

| | | |
|---|---|---|
| 406036683A | 7/1992 | Japan . |
| 407106174A | 10/1993 | Japan . |
| 409237976A | 2/1996 | Japan . |
| 411086723A | 7/1998 | Japan . |

*Primary Examiner*—John F. Niebling
*Assistant Examiner*—Viktor Simkovic

[57] ABSTRACT

A method for creating via holes in a chip or a plurality of chips of a wafer is disclosed. The method is performed by using a pre-patterned transparent mask on the back of the chip or chips, and bombarding the chip(s) through the positioning holes on the transparent mask that correspond to the pre-formed pattern, with accelerated particles. According to this method, via holes can be created from the back of the chip(s) without interfering with the existing IC structure of the chip(s). The present method is highly efficient because a number of via holes can be formed simultaneously by using a large pre-pattened mask to cover the entire wafer. In addition, the present method is cost-effective because no precision apparatus is required.

19 Claims, 6 Drawing Sheets

METHOD FOR CREATING VIA HOLE IN CHIP

BACKGROUND OF THE INVENTION

1. Field of the Invention

The present invention is related to a method for creating via holes in a chip, and more particularly to a method for precisely and rapidly creating via holes in a chip by using a parent mask.

2. Description of the Related Art

In chip-processing techniques, the method for creating via holes in a chip plays an important role in determining chip properties and cost controls. Therefore, it is necessary for those who engaged in the art to develop an improved method for creating via holes in a chip.

So far, a computer-positioned sand-blowing method and a laser processing method have been used for creating via holes. These methods, however, have disadvantages. For an ultrasonic method, the processed chip is subject to breaking. For a computer-positioned sand-blowing method, via holes are created one-by-one so as to consume much time. In addition, the precision spread head is diminished rapidly so as to increase cost. For a laser processing method, the laser equipment is expensive and inefficient. That is, much time will be required for creating via holes by the laser processing method.

SUMMARY OF THE INVENTION

An object of the present invention is to provide a method for creating via holes in a chip by using a pre-patterned transparent mask on the back of the chip so that via holes can be created from the back of the chip according to pre-formed pattern without interfering with the existing IC structure.

Another object of the present invention is to provide a low cost and high efficient method for simultaneously creating via holes in a plurality of chips of a wafer. This object can be achieved by using a pre-patterned transparent mask to cover the back of the entire wafer, and penetrating the wafer at via hole positions through the mask with accelerated particles.

The present invention is related to a method for creating a via hole in a chip having thereon an integrated circuit structure on a first face thereof. The method includes the steps of determining a first position of a via hole to be created on the first face of the chip as desired; determining a second position on a second face of the chip, wherein the second face is opposite to the first face, and the second position is right aligned with the first position; attaching a transparent mask having thereon a positioning hole to the second face, and having the positioning hole aligned with the second position; and bombarding the chip through the positioning hole of the transparent mask with accelerated particles so as to create the via hole at the first position.

The transparent mask is preferably made of a polymer material such as polyester, and can be attached to the second face by gluing. The positioning hole of the transparent mask can be formed by a laser processing technique. The accelerated particles are preferably sand grains projected from a sand blower.

In accordance with a preferred embodiment of the present invention, the step of determining the second position includes sub-steps of attaching a transparent film onto the first face, wherein the transparent film has thereon a first positioning mark and a via hole pattern aligned with the first position; providing a second positioning mark on the transparent mark, wherein the second positioning mark is aligned with the first positioning mark to have the positioning hole of the transparent mask located at the second position; and releasing the transparent film. The transparent film is larger than the chip, and the first positioning mark is located on the transparent film outside a chip area. The transparent mask is larger than the chip, and the second positioning mark is located on the transparent mask outside the chip area. The second positioning mark on the transparent mask can also be formed by a laser processing technique. The transparent film is preferably a camera film, and more preferably a positive film, obtained by taking a picture for the integrated circuit structure of the chip. The via hole pattern on the transparent film is aligned with the first position by aligning the picture of the integrated circuit structure on the transparent film with the integrated circuit structure on the first face of the chip under the facilitation of a microscope.

According to another aspect of the present invention, the method preferably further includes the steps of providing a protective layer on the first face of the chip after determining the second position for protecting the integrated circuit structure of the chip from damage resulting from the accelerated particles, and providing an isolation layer on the protective layer to isolate the protective layer from the surroundings.

The protective layer is preferably a water-borne gelatinous material such as an image pro super adhesive, and the isolation layer is, for example, a paper sheet. The image pro super adhesive is coated on the first face and baked for about 1–5 minutes at a temperature range between about 80° C. and about 120° C. in order to form the protective layer.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented for purpose of illustration and description only; and they are not intended to be exhaustive or to be limited to the precise form disclosed.

The present invention is used for creating a via hole in a chip. The embodiments of the present invention will be illustrated as follows by simultaneously creating via holes for a plurality of identical chips on a wafer. The chips have an existing integrated circuit (IC) on first faces of the chips. It is to be noted that the present invention creates via holes from the back of the chip (wafer) in order not to damage the existing IC structures of the chips.

Embodiment 1

Figure 1:
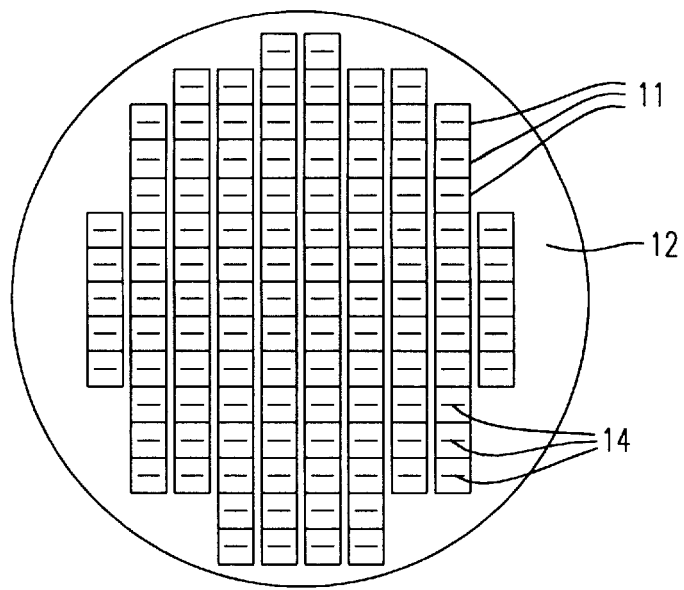
FIG. 1 is a schematic diagram showing a wafer including a plurality of identical chips having therein integrated circuit.
Figure 2:
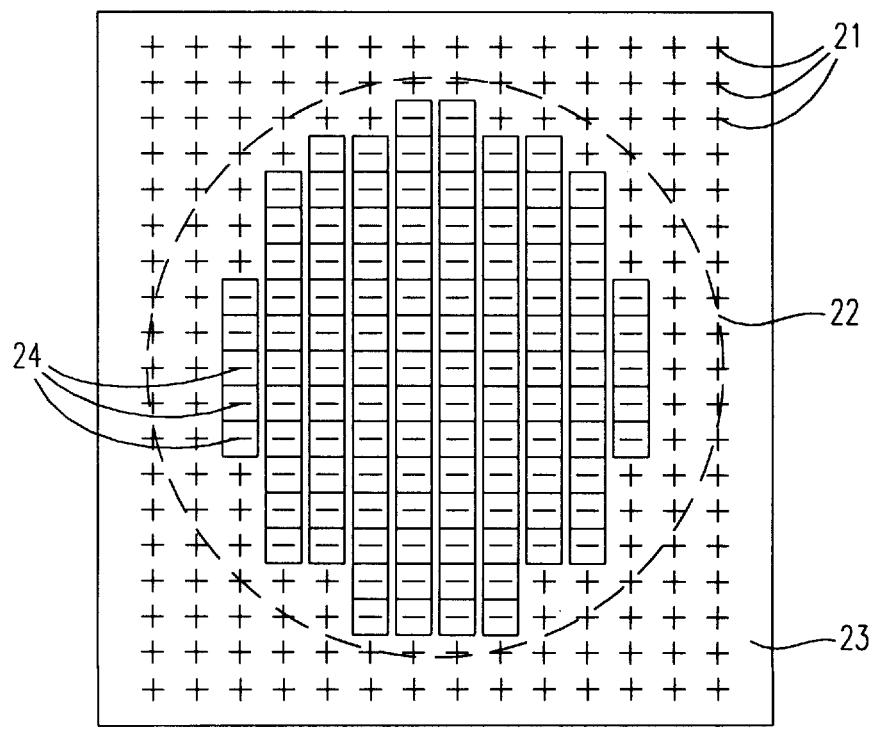
FIG. 2 is a schematic diagram showing a preferred embodiment of a positive film used in the present invention.

First of all, take a picture for the IC structure of the chips 11 on the entire wafer 12, as shown in FIG. 1, to obtain a positive film shown in FIG. 2. Auxiliary via hole positions 14 are provided on the positive film 23. The positive film 23 is larger than the wafer area 22 so that positioning marks 21 can be provided on the positive film 23 outside the wafer area 22. The positioning marks 21 are used for determining locations on the back of the wafer 12, which correspond to via hole positions 14 to formed via holes threat (FIG. 1), so that the via holes can be created on or formed from the back face of the wafer. The method for determining the locations by the positioning marks 21 will be described later. In this embodiment, the positioning marks 21 can be easily made by directly extending the marks representing the auxiliary via hole positions 24 outwards because the clearances of every two via holes for the identical chips are the same. In other embodiments, it can be understood by those skilled in the art that various kinds of positioning marks can be provided.

Figure 3:
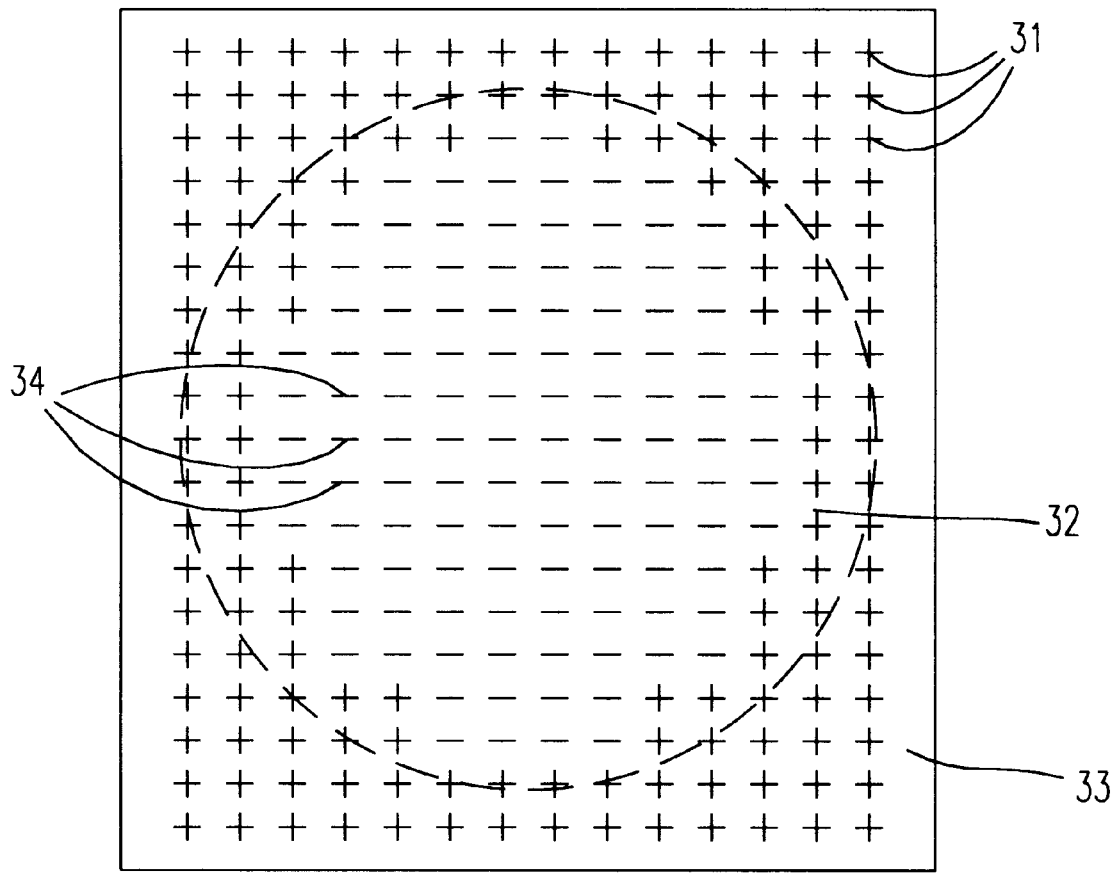
FIG. 3 is a schematic diagram showing a preferred embodiment of a transparent mask used in the present invention.

Afterwards, a transparent mask 33 that is larger than the wafer area 32, as shown in FIG. 3, is provided. The transparent mask 33 has formed thereon a plurality of positioning holes 34 which are produced according to the via hole positions 14. There are also positioning marks 31 provided on the transparent mask 33 in a manner similar to the positioning marks 21 in order to determine the locations on the back of the wafer 12 where the via holes will be formed. The method for determining the locations by the positioning marks 21 and 31 will be described later.

Figure 4A:
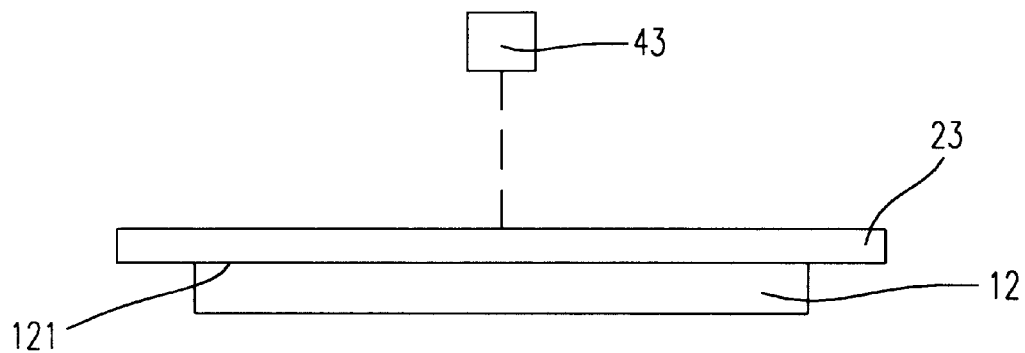
FIG. 4A–4C schematically show the steps for creating via holes by use of the positive film and the transparent mask of FIGS. 2 and 3, respectively, according to the present invention.
Figure 4B:
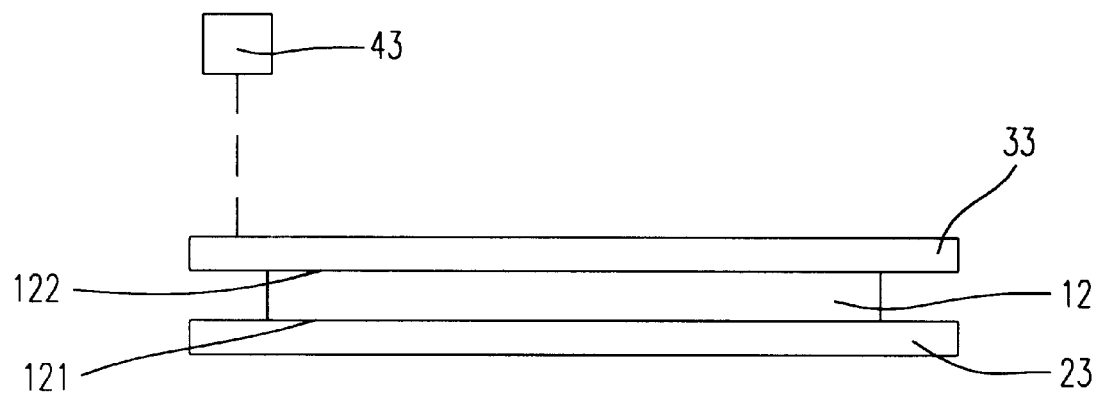
Figure 4C:
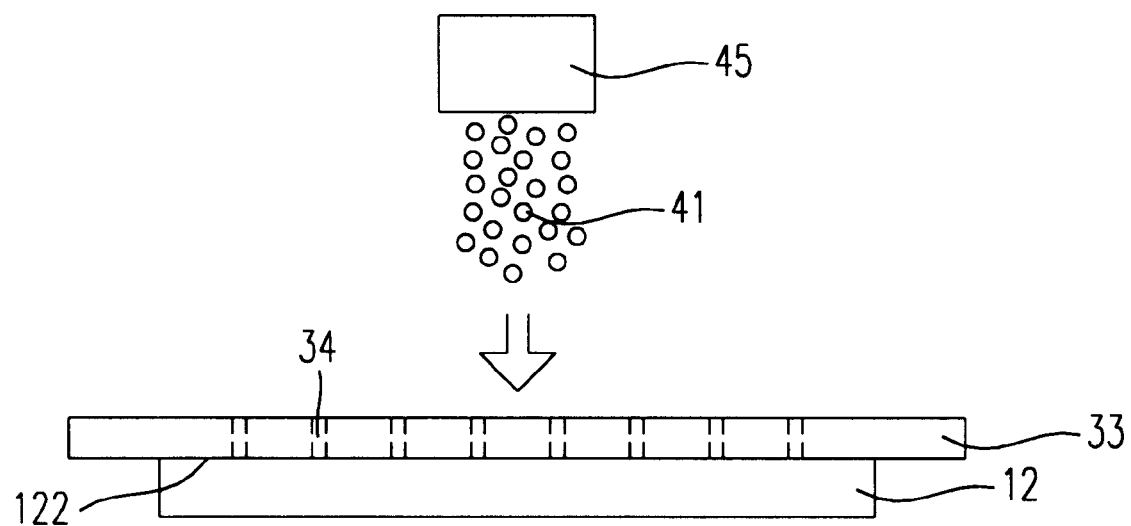

Please refer to FIGS. 4A–4C which schematically show steps of this embodiment. First of all, the positive film 23 is releasably attached onto the first face 121 of the wafer 12 having thereon the IC structure with the photographed IC structure on the positive film 23 being completely overlapped with the real IC structure of the chips 11 under the facilitation of a microscope 43. Then, the wafer 12 with the positive film 23 is turned upside down. The transparent mask 33 is glued to the back face 122 of the wafer with the positioning marks 31 of the transparent mask 33 being accurately aligned with the positioning marks 21 of the positive film 23 (FIGS. 2 and 3). Consequently, the positioning holes 34 (FIG. 3) will be accurately aligned with the via hole positions 14 (FIG. 1) to determine the locations on the back face 122 of the wafer 12 where the via holes will be formed. After determining the locations at which the formed via holes will be formed, the positive film 23 is released from the wafer 12, and via holes are created from the back face 122 of the wafer 12.

Please refer to FIG. 4C, in which a sand blower 45 capable of projecting sand grains 41 is used to provide sufficient power to penetrate the wafer 12 through the positioning holes 34 of the transparent mask 33. The other portions covered by the transparent mask 33 will not be penetrated by sand grains. In this way, via holes at different desired locations can be simultaneously created. It should be understood that other accelerated particles capable of providing sufficient power to penetrate the wafer can also be used.

Embodiment 2

This embodiment is similar to Embodiment 1 except that a protecting layer and an isolation layer are provided to protect the IC structure of the chips during the via hole creating process. Creating via holes in a chip according Embodiment 1 has improved the conventional methods. Creating via holes in a chip according Embodiment 2 offers an even better affect.

Figure 5:
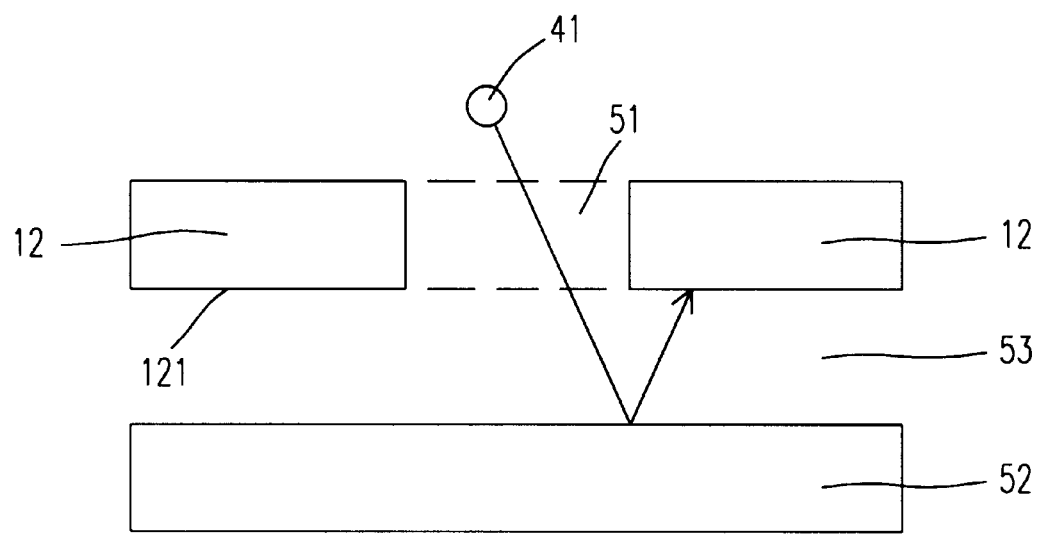
FIG. 5 is an amplified view of a portion of a wafer, which schematically shows a situation after the sand grains penetrate the wafer.

Please refer to FIG. 5, which schematically shows the situation after the sand grains penetrate the wafer to form the via hole as in embodiment 1. When the sand-blowing operation as shown in FIG. 4C is performed, the wafer 12 is generally placed on a tray 52 with the face 121 having thereon the IC structure in contact with the tray 52. There might be a gap or empty space 53 between the face 121 and the tray 52. If the empty space 53 exists, the sand grains 41 penetrating the wafer 12 through the via hole 51 are likely to be reflected from the tray 52 and hit the IC structure on the face 121. In addition, the sand grains 41 are also likely to deposit or collect in the gap 53. Therefore, protecting means are preferably provided to avoid the reflection and the deposition of the sand grains and to protect the IC structure.

Figure 6:
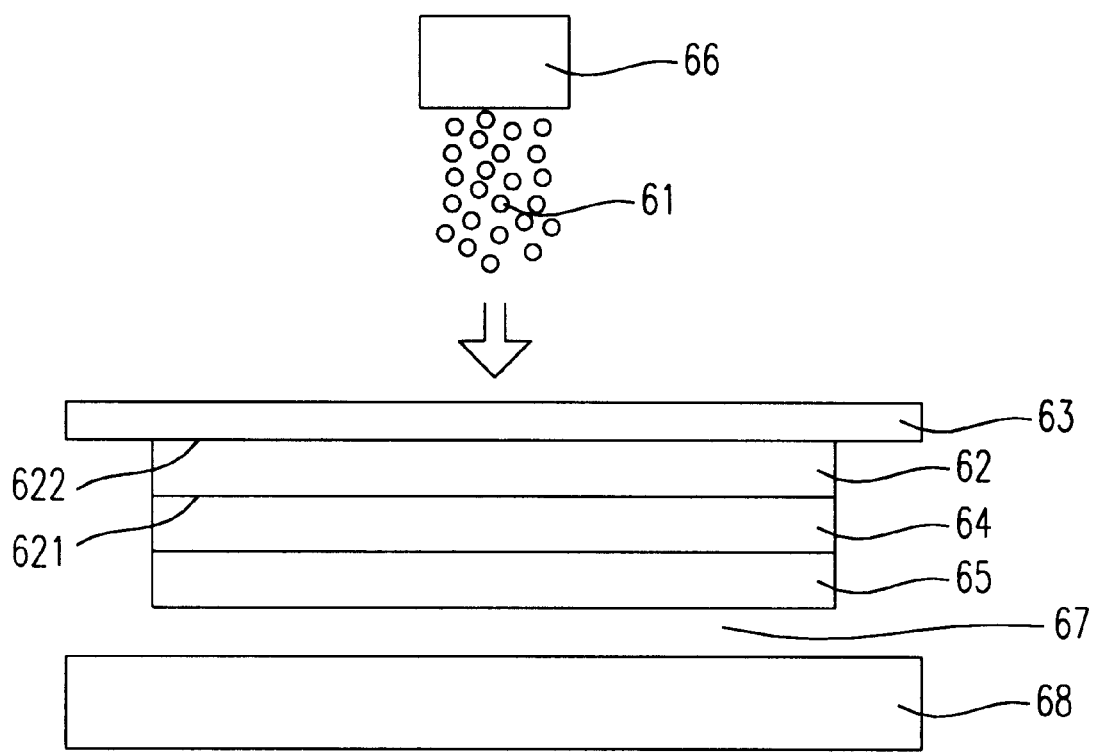
FIG. 6 schematically shows the steps of another embodiment of the present invention.

Please refer to FIG. 6, which schematically shows the steps of embodiment 2. In addition to having a transparent mask 63 glued on a face 622 of a wafer 62, a protecting layer 64 is provided on another face 621 of the wafer 62 which face 621 has an integrated circuit thereon. The protecting layer used in this embodiment is an image pro super (IPS) adhesive layer which is coated on the face 622 and baked for about 1–5 minutes under a temperature range of about 80° C. and about 120° C. Afterwards, a paper sheet 65 is provided as an isolation layer to cover the IPS layer 64 and isolate the IPS layer 64 from the surroundings, i.e., a tray 68 for loading the resulting wafer. In this way, the sand grains 61 projected from the sand blower 66 will not reach the tray 68 through vacant space 67 and be reflected and deposited as described above.

From the above description, it is apparent that the present method for creating via holes in chips is highly efficient because a number of via holes can be formed simultaneously. In addition, the present method is cost-effective because no precision apparatus is required, the positive film can be repetitively used, and the sand grains can be recycled.

While the invention has been describe din terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded the broadest interpretation so as to encompass all such modifications and similar structures.

What is claimed is:

1. A method for creating a via hole in a chip having thereon an integrated circuit structure on a first face thereof, comprising steps of:

determining a first position of a via hole to be created on said first face of said chip as desired;

determining a second position on a second face of said chip, wherein said second face is opposite to said first face, and said second position is aligned with said first position;

attaching a transparent mask having thereon a positioning hole to said second face, and having said positioning hole aligned with said second position; and bombarding said chip through said positioning hole of said transparent mask with accelerated particles so as to create said via hole at said first position.

2. The method according to claim 1 wherein said transparent mask is made of a polymer material.

3. The method according to claim 2 wherein said polymer material is polyester.

4. The method according to claim 1 wherein said transparent mask is attached to said second face by gluing.

5. The method according to claim 1 wherein said positioning hole of said transparent mask is formed by a laser processing technique.

6. The method according to claim 1 wherein said step of determining said second position includes the sub-steps of:

attaching a transparent film onto said first face, wherein said transparent film has thereon a first positioning mark and a via hole pattern aligned with said first position;

providing a second positioning mark on said transparent mark, wherein said second positioning mark is aligned with said first positioning mark to have said positioning hole of said transparent mask located at said second position; and releasing said transparent film.

7. The method according to claim 6 wherein said transparent film is larger than said chip, and said first positioning mark is located on said transparent film outside a chip area.

8. The method according to claim 7 wherein said transparent mask is larger than said chip, and said second positioning mark is located on said transparent mask outside said chip area.

9. The method according to claim 6 wherein said second positioning mark on said transparent mask is formed by a laser processing technique.

10. The method according to claim 6 wherein said transparent film is a camera film obtained by taking a picture for said integrated circuit structure of said chip.

11. The method according to claim 10 wherein said camera film is a positive film.

12. The method according to claim 11 wherein said via hole pattern on said transparent film is aligned with said first position by aligning said picture of said integrated circuit structure on said transparent film with said integrated circuit structure on said first face of said chip under the facilitation of a microscope.

13. The method according to claim 1 further comprising a step of providing a protective layer on said first face of said chip after determining said second position for protecting said integrated circuit structure of said chip from damage resulting from said accelerated particles.

14. The method according to claim 13 wherein said protective layer is a water-borne gelatinous material.

15. The method according to claim 14 wherein said water-borne gelatinous material is an image pro super adhesive.

16. The method according to claim 15 wherein said image pro super adhesive is coated on said first face and baked for 1~5 minutes under a temperature ranged between 80° C. and about 120° C. to form said protective layer.

17. The method according to claim 13 further comprising a step of providing an isolation layer on said protective layer to isolate said protective layer from the surrounding.

18. The method according to claim 17 wherein said isolation layer is made of paper.

19. The method according to claim 1 wherein said accelerated particles are sand grains projected from a sand blower.

* * * * *